US008796783B2

(12) United States Patent
Fan et al.

(10) Patent No.: US 8,796,783 B2
(45) Date of Patent: Aug. 5, 2014

(54) BORDERLESS CONTACT STRUCTURE EMPLOYING DUAL ETCH STOP LAYERS

(71) Applicant: International Business Machines Corporation, Armonk, NY (US)

(72) Inventors: Su C. Fan, Cohoes, NY (US); David V. Horak, Essex Junction, VT (US); Charles W. Koburger, Delmar, NY (US); Shom Ponoth, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/777,410

(22) Filed: Feb. 26, 2013

(65) Prior Publication Data

US 2013/0168749 A1    Jul. 4, 2013

Related U.S. Application Data

(62) Division of application No. 13/095,955, filed on Apr. 28, 2011.

(51) Int. Cl.
*H01L 29/41* (2006.01)
(52) U.S. Cl.
USPC .................... 257/382; 257/637; 257/E29.116
(58) Field of Classification Search
USPC .................................. 257/382, 637, E29.116
See application file for complete search history.

(56) References Cited

U.S. PATENT DOCUMENTS

| 2002/0042196 A1* | 4/2002 | Lee ............................... 438/636 |
| 2002/0070398 A1* | 6/2002 | Lee ............................... 257/296 |
| 2002/0100943 A1* | 8/2002 | Ogata et al. .................... 257/382 |
| 2003/0127678 A1* | 7/2003 | Shimizu et al. ................ 257/306 |
| 2004/0173833 A1* | 9/2004 | Tsugane et al. ................ 257/296 |
| 2006/0024933 A1* | 2/2006 | Juengling ...................... 438/542 |

FOREIGN PATENT DOCUMENTS

JP        05343669 A    * 12/1993

OTHER PUBLICATIONS

Office Action dated Aug. 5, 2013 received in a related U.S. Patent Application, namely U.S. Appl. No. 13/095,955.

* cited by examiner

*Primary Examiner* — Zandra Smith
*Assistant Examiner* — Toniae Thomas
(74) *Attorney, Agent, or Firm* — Scully, Scott, Murphy & Presser, P.C.; Yuanmin Cai

(57) ABSTRACT

Each gate structure formed on the substrate includes a gate dielectric, a gate conductor, a first etch stop layer, and a gate cap dielectric. A second etch stop layer is formed over the gate structures, gate spacers, and source and drain regions. A first contact-level dielectric layer and a second contact-level dielectric layer are formed over the second etch stop layer. Gate contact via holes extending at least to the top surface of the gate cap dielectrics are formed. Source/drain contact via holes extending to the interface between the first and second contact-level dielectric layers are subsequently formed. The various contact via holes are vertically extended by simultaneously etching exposed gate cap dielectrics and exposed portions of the first contact-level dielectric layer, then by simultaneously etching the first and second etch stop layers. Source/drain contact vias self-aligned to the outer surfaces gate spacers are thereby formed.

20 Claims, 13 Drawing Sheets

BORDERLESS CONTACT STRUCTURE EMPLOYING DUAL ETCH STOP LAYERS

CROSS REFERENCE TO RELATED APPLICATION

This application is a divisional of U.S. patent application Ser. No. 13/095,955 filed on Apr. 28, 2011, the entire content and disclosure of which are incorporated herein by reference.

BACKGROUND

The present disclosure relates to semiconductor structures, and particularly to a borderless contact structure employing dual etch stop layers and methods of manufacturing the same.

As semiconductor devices shrink in each generation of semiconductor technology, formation of contact structures to gate conductors and source and drain regions of a field effect transistor become challenging because such contact structures not only need to provide reliable electrical contact to the gate conductors or the source and drain regions, but also need to avoid electrically shorting to other components. Thus, contact structures designed to provide electrical contact to a source or drain region should not contact a gate conductor, and vice versa. Since the etch chemistry employed for the anisotropic contact etch process remains the same while the lateral dimension of the dielectric gate spacer shrinks with the scaling of semiconductor devices, the likelihood of overlay variations during lithographic processes causing formation of contact structures that electrically short a source/drain region to a gate conductor of a field effect transistor increases in each generation.

The challenge of preventing undesirable electrical shorts between a contact structure and adjacent conductive structures becomes more complex when multiple exposure-and-etch schemes are employed to form contact features. Thus, there exists a need to provide a reliable and electrical-short-proof method of forming contact structures for integrated semiconductor device circuit structures.

BRIEF SUMMARY

Dual etch stop layers are employed to enable simultaneous formation of contact structures to gate conductors and contact structures to electrical components in a substrate such as source and drain regions of a field effect transistor. Each gate structure formed on the substrate includes a gate dielectric, a gate conductor, a first etch stop layer, and a gate cap dielectric. A gate spacer is formed on the sidewalls of each gate structure, and raised source and drain regions may be formed as needed. A second etch stop layer is formed over the gate structures, gate spacers, and raised source and drain regions. A first contact-level dielectric layer and a second contact-level dielectric layer are formed over the second etch stop layer.

Gate contact via holes extending at least to the top surface of the gate cap dielectrics are formed. Source/drain contact via holes extending to the interface between the first and second contact-level dielectric layers are subsequently formed. The gate contact via holes and/or the source/drain contact via holes can be formed by multiple exposes and multiple etches, in which previously formed contact via holes are filled with a planarizing etch-resistant material during formation of additional contact via holes.

The various contact via holes are vertically extended by simultaneously etching exposed gate cap dielectrics and exposed portions of the first contact-level dielectric layer, then by simultaneously etching the first and second etch stop layers. Exposed first etch stop layers in the gate structures and exposed portions of the second etch stop layer are simultaneously etched. Source/drain contact via holes self-aligned to the outer surfaces gate spacers are thereby formed. Contact via structures are subsequently formed by filling the various contact via holes with a conductive material.

According to an aspect of the present disclosure, a method of forming a semiconductor structure includes: forming at least one gate structure on a semiconductor substrate, wherein each of the at least one gate structure includes, from bottom to top, a gate dielectric, a gate conductor, a first etch stop layer, and a gate cap dielectric; forming a second etch stop layer on the at least one gate structure; forming a stack of a first contact-level dielectric layer and a second contact-level dielectric layer over the second etch stop layer; forming at least one gate contact via hole and at least one source/drain contact via hole within the stack of the first and second contact-level dielectric layers; and simultaneously extending the at least one gate contact via hole and the at least one source/drain contact via hole, wherein the at least one gate contact via hole is extended through the first contact-level dielectric layer stopping on the second etch stop layer and the at least one source/drain contact via hole is extended through one of the at least one gate cap dielectric stopping on one of the at least one first etch stop layer, respectively, during the simultaneous extension.

According to another aspect of the present disclosure, a semiconductor structure includes: at least one gate structure located on a semiconductor substrate, wherein each of the at least one gate structure includes, from bottom to top, a gate dielectric, a gate conductor, a first etch stop layer, and a gate cap dielectric; a second etch stop layer located on the at least one gate structure; a first contact-level dielectric layer and a second contact-level dielectric layer located over the second etch stop layer; at least one gate contact via structure embedded in the first and second contact-level dielectric layers, wherein each of the at least one gate contact via structure extends through the first and second contact-level dielectric layers, the second etch stop layer, one of the at least one gate cap dielectric, and one of the at least one first etch stop layer; and at least one source/drain contact via structure embedded in the first and second contact-level dielectric layers, wherein each of the at least one source/drain contact via structure extends through the first and second contact-level dielectric layers and the second etch stop layer and contacts a source/drain region on the semiconductor substrate.

DETAILED DESCRIPTION

Figure 1:
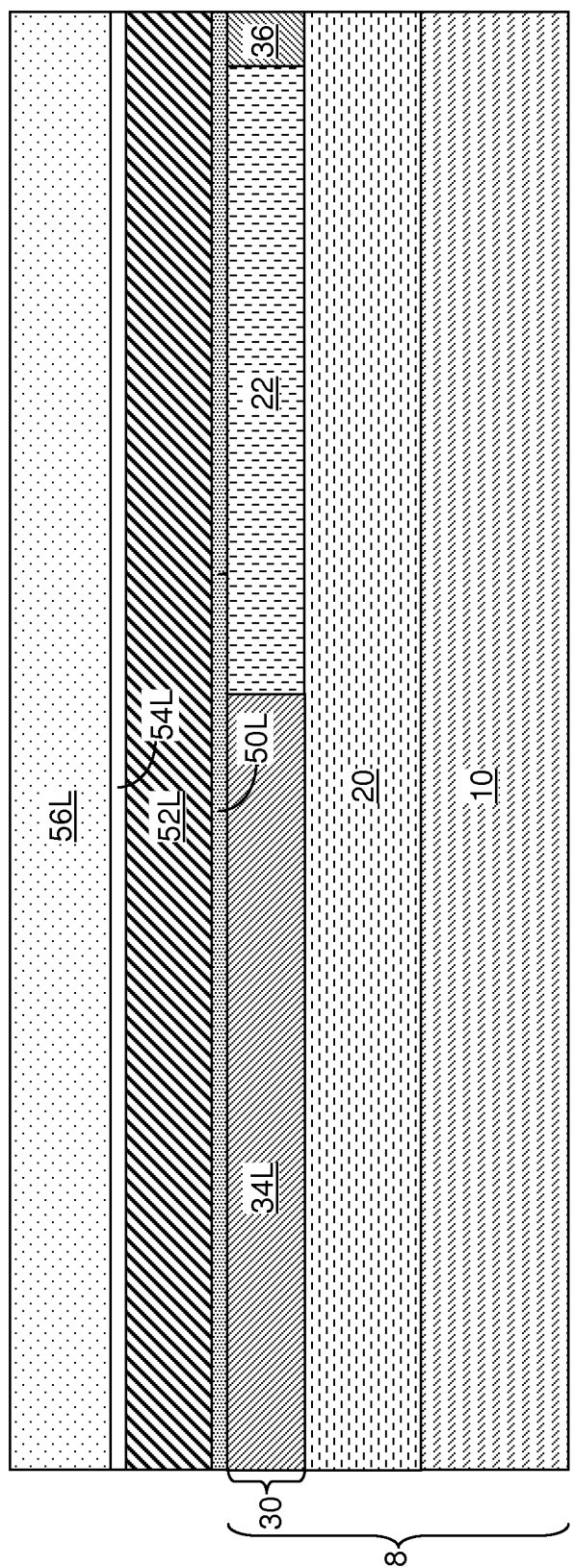
FIG. 1 is a vertical cross-sectional view of a first exemplary semiconductor structure according to a first embodiment of the present disclosure after formation of a stack of a gate dielectric layer, a gate conductor layer, a contiguous etch stop layer, and a gate cap dielectric layer.

As stated above, the present disclosure relates to a borderless contact structure employing dual etch stop layers and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to a first embodiment of the present disclosure includes gate-level layers formed on a semiconductor substrate 8. The substrate 8 can be a semiconductor-on-insulator (SOI) substrate including a vertical stack of a handle substrate 10, a buried insulator layer 20, and a top semiconductor layer 30. The handle substrate 10 can include a semiconductor material, a dielectric material, a conductive material, or a combination thereof. For example, the handle substrate 10 can be a single crystalline silicon substrate. The buried insulator layer 20 includes a dielectric material such as silicon oxide, silicon nitride, silicon oxynitride, or a combination thereof. The top semiconductor layer 30 includes a semiconductor material such as silicon, germanium, a silicon-germanium alloy, a III-V compound semiconductor, a II-VI compound semiconductor, any other semiconductor material known in the art, or combinations thereof. The semiconductor material in the top semiconductor layer 30 can be single crystalline. Alternatively, the semiconductor substrate 8 can be a bulk substrate instead of an SOI substrate in which a semiconductor material contiguously extends from a topmost surface of the semiconductor substrate 8 to a bottommost surface of the semiconductor substrate 8.

Shallow trench isolation structures 22 can be formed in the top semiconductor layer 22. For example, shallow trenches can be formed in the top semiconductor layer 30 and filled with a dielectric material such as silicon oxide, silicon nitride, silicon oxynitride, or a combination thereof, and excess dielectric material above the top surface of the top semiconductor layer 30 can be removed by a planarization process such as chemical mechanical planarization (CMP) to form the shallow trench isolation structures 22. The remaining portions of the top semiconductor layer 30 include a first active region 34L and a second active region 36. P-type dopants and/or n-type dopants can be implanted into the first active region 34L and the second active region 36.

A gate dielectric layer 50L, a gate conductor layer 52L, a contiguous etch stop layer 54L, and a gate cap dielectric layer 56L are sequentially deposited, for example, by various chemical vapor deposition processes or other deposition processes known in the art.

The gate dielectric layer 50L includes a dielectric material, which can be silicon oxide, silicon nitride, silicon oxynitride, or a stack thereof. Alternately, the gate dielectric layer 50L can be a high dielectric constant (high-k) material layer having a dielectric constant greater than 8.0. In one embodiment, the gate dielectric layer 50L can include a dielectric metal oxide, which is a high-k material containing a metal and oxygen, and such metal oxides are known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, and preferably from 1.0 nm to 3 nm, although lesser and greater thicknesses can also be employed.

The gate conductor layer 52L includes a conductive material, which can be a doped semiconductor material, a metallic material, or a combination thereof. The doped semiconductor material can include doped polysilicon, doped polycrystalline germanium, a doped silicon-germanium alloy, or any other doped semiconductor material. The metallic material, if employed, can be selected to optimize the performance of a transistor to be subsequently formed. Metallic materials that can be included in the gate conductor layer 52L include, but are not limited to, Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, W, and TiAl, alloys thereof, conductive oxides thereof, conductive nitrides thereof, and any combinations of the foregoing. The gate conductor layer 52L can be deposited, for example, by chemical vapor deposition (CVD) and/or physical vapor deposition and/or any other deposition methods available in the art. The thickness of the gate conductive layer 52L can be from 20 nm to 300 nm, although lesser and greater thicknesses can also be employed.

The contiguous etch stop layer 54L can include a dielectric material or a conductive material. In one embodiment, the contiguous etch stop layer 54L includes a dielectric material, which can be, for example, silicon oxide, silicon nitride or a dielectric metal oxide. If the contiguous etch stop layer 54L includes silicon oxide or silicon nitride, the contiguous etch stop layer 54L can be formed by chemical vapor deposition (CVD). Alternatively, the contiguous etch stop layer 54L can be a high dielectric constant (high-k) material layer having a dielectric constant greater than 8.0. In one embodiment, the contiguous etch stop layer 54L can include a dielectric metal oxide. Dielectric metal oxides can be deposited by methods well known in the art as discussed above. Any dielectric metal that can be employed for the gate dielectric layer 50L as discussed above can also be employed for the contiguous etch stop layer 54L.

In one embodiment, the contiguous etch stop layer 54L can include a material selected from $HfO_2$, $Y_2O_3$, and $Al_2O_3$. In another embodiment, the contiguous etch stop layer 54L can include a conductive metallic compound such as TaN, TiN, WN, TaC, TiC, WC, or a combination thereof. The thickness of the contiguous etch stop layer 54L can be from 1 nm to 30 nm, and typically from 2 nm to 15 nm, although lesser and greater thicknesses can also be employed.

The gate cap dielectric layer 56L includes a dielectric material such as silicon nitride, silicon oxide, organosilicate glass (OSG), or a combination thereof. The gate cap dielectric layer 56L includes a material that is different from the material of the contiguous etch stop layer 54L so that portions of the gate cap dielectric layer 56L can be etched selective to the material of the contiguous etch stop layer 54L. For example, if the contiguous etch stop layer 54L includes silicon nitride, the gate cap dielectric layer 56L includes a dielectric material other than silicon nitride such as silicon oxide or organosilicate glass. If the contiguous etch stop layer 54L includes silicon oxide, the gate cap dielectric layer 56L includes a dielectric material other than silicon oxide such as silicon nitride or organosilicate glass. If the etch stop layer 54L includes a high dielectric constant (high-k) material, the gate cap dielectric layer 56L includes a dielectric material other than that high dielectric constant (high-k) material such as silicon oxide, silicon nitride, or organosilicate glass. The thickness of the gate cap dielectric layer 56L can be from 10 nm to 200 nm, and typically from 20 nm to 50 nm, although lesser and greater thicknesses can also be employed.

Figure 2:
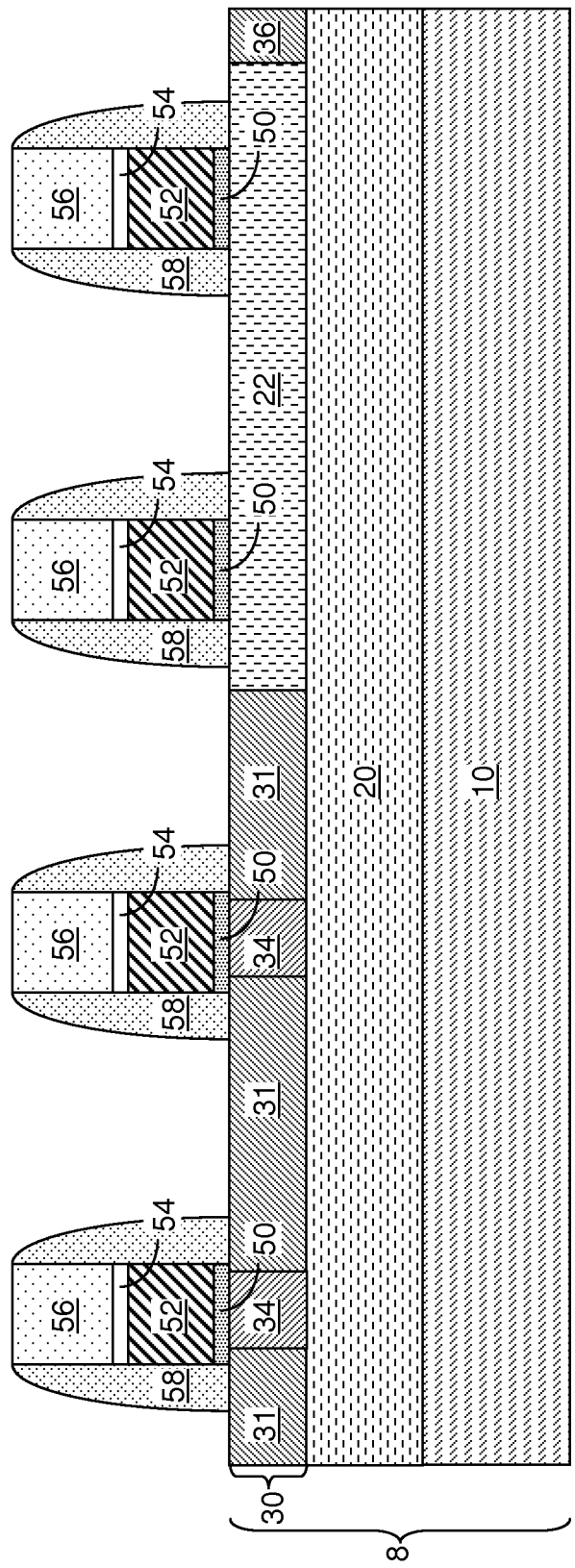
FIG. 2 is a vertical cross-sectional view of the first exemplary semiconductor structure according to the first embodiment of the present disclosure after formation of gate structures, planar source/drain regions, and gate spacers.

Referring to FIG. 2, a photoresist (not shown) is applied over the gate cap dielectric layer 56L and is lithographically patterned, for example, by lithographic exposure and development. The pattern in the photoresist is transferred into the stack of the gate cap dielectric layer 56L, the contiguous etch stop layer 54L, the gate conductor layer 52L, and the gate dielectric layer 50L to form gate structures. Some gate structures can be formed directly on a semiconductor surface of the top semiconductor layer 30 such as the first active region 34L, and some other gate structures can be formed directly on the shallow trench isolation structure 22, or portions of the gate structures can form partially over the top of semiconductor layer 30 and partially on the shallow trench isolation structure 22.

Each gate structure includes, from bottom to top, a gate dielectric 50, a gate conductor 52, a first etch stop layer 54, and a gate cap dielectric 56. Each gate cap dielectric 56 is a remaining portion of the gate cap dielectric layer 56L. Each first etch stop layer 54 is a remaining portion of the contiguous etch stop layer 54L. Each gate conductor 52 is a remaining portion of the gate conductor layer 52L. Each gate dielectric 50 is a remaining portion of the gate dielectric layer 50L.

Dopants of the opposite conductivity type than the doping type of the first active region 34L is implanted into areas not covered by the gate structures to form planar source/drain regions 31. For example, if the first active region 34L has a p-type doping, n-type dopants can be implanted to form planar source/drain regions 31 that have an n-type doping. Conversely, if the first active region 34L has an n-type doping, p-type dopants can be implanted to form planar source/drain regions 31 that have a p-type doping. The unimplanted portions of the first active region 34L, which are located underneath the gate structures (50, 52, 54, 56), are body regions 34 of a transistor.

Gate spacers 58 are formed on sidewalls of the gate structures (50, 52, 54, 56) by conformal deposition of a dielectric material layer and an anisotropic etch of horizontal portions of the dielectric material layer. The remaining vertical portions of the dielectric material layer constitute the gate spacers 58. Each gate spacer 58 laterally surrounds a gate structure (50, 52, 54, 56).

Figure 3:
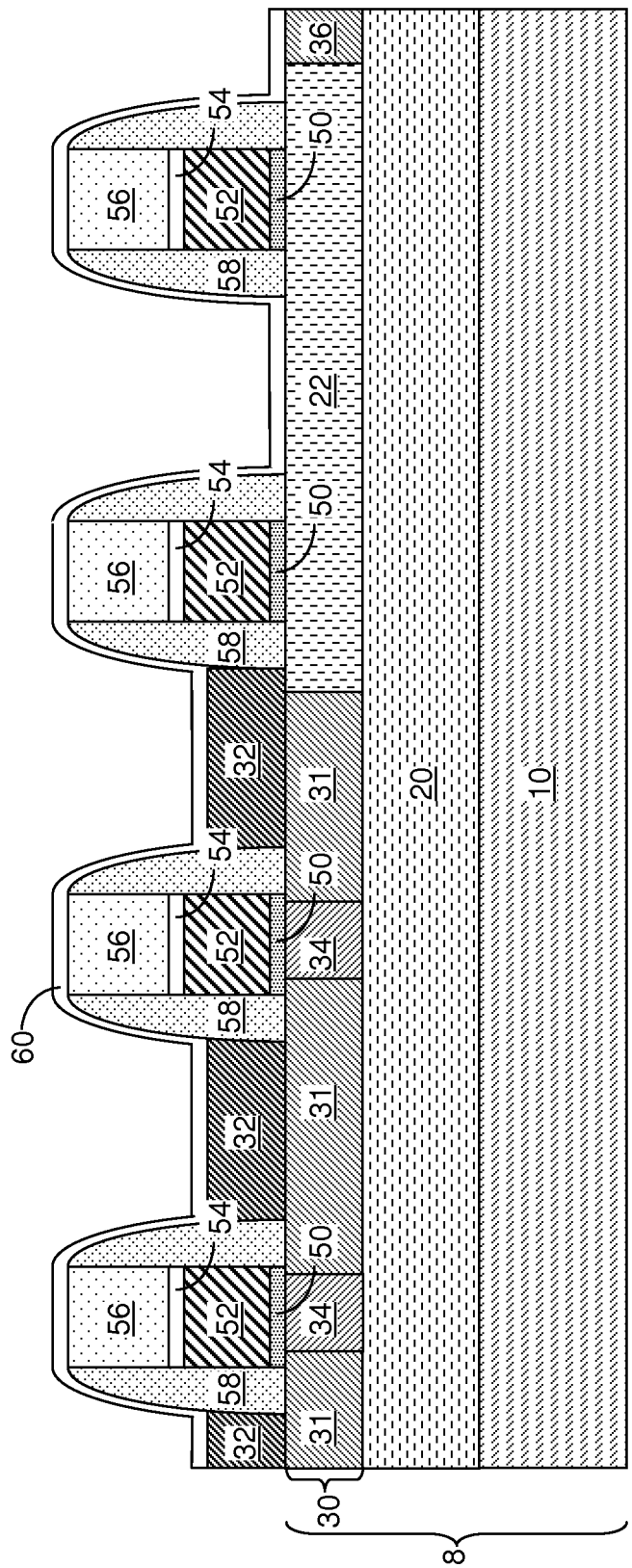
FIG. 3 is a vertical cross-sectional view of the first exemplary semiconductor structure according to the first embodiment of the present disclosure after formation of raised source/drain regions and a second etch stop layer.

Referring to FIG. 3, raised source/drain regions 32 can be formed, for example, by selective epitaxy. During a selective epitaxy step, a semiconductor-containing reactant and an etchant are simultaneously or alternately flowed into a reaction chamber including the first exemplary semiconductor structure. Dopants having the same conductivity type as the doping of the planar source/drain regions 31 are introduced into the raised source/drain regions 32 by in-situ doping or by ion implantation. The raised source/drain regions 32 include a doped semiconductor material such as doped silicon, doped germanium, a doped silicon-germanium alloy, or a doped compound semiconductor material. In some embodiments, the raised source/drain regions 32 are epitaxially aligned to an underlying planar source/drain region 31. The thickness of the raised source/drain regions 32 can be from 3 nm to 200 nm, and typically from 10 nm to 50 nm, although lesser and greater thicknesses can also be employed. A stack of a raised source/drain region 32 and an underlying planar source/drain region 31 collectively constitute a "source/drain," which herein refers to a source, a drain, or a common node that functions as a source of a transistor and a drain of another transistor.

A second etch stop layer 60 is deposited directly on exposed surfaces of the gate structures, i.e., the top surfaces of the gate cap dielectrics 56, and the exposed surfaces of the gate spacers 58, the raised source/drain regions 32, and the top semiconductor layer 30. The second etch stop layer 60 includes a dielectric material. In one embodiment, the second etch stop layer 60 includes a dielectric material, which can be, for example, silicon oxide, silicon nitride or a dielectric metal oxide. If the second etch stop layer 60 includes silicon oxide or silicon nitride, the second etch stop layer 60 can be formed by chemical vapor deposition (CVD). Alternatively, the second etch stop layer 60 can be a high dielectric constant (high-k) material. In one embodiment, the second etch stop layer 60 can include a dielectric metal oxide. Dielectric metal oxides can be deposited by methods well known in the art as discussed above. Any dielectric metal that can be employed for the gate dielectric layer 50L or the contiguous etch stop layer 54L as discussed above can also be employed for the second etch stop layer 60. In one embodiment, the second etch stop layer 60 can include a dielectric material selected from $HfO_2$, $Y_2O_3$, and $Al_2O_3$. The thickness of the second etch stop layer 60 can be from 1 nm to 30 nm, and typically from 2 nm to 15 nm, although lesser and greater thicknesses can also be employed.

In one embodiment, the first etch stop layers 54 and the second etch stop layer 60 include the same dielectric metal oxide such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, in which each value of x is independently from 0.5 to 3 and each value of y is independently from 0 to 2. For example, the first etch stop layers 54 and the second etch stop layer 60 can include a dielectric material selected from $HfO_2$, $Y_2O_3$, and $Al_2O_3$.

In another embodiment, each of the first etch stop layers 54 and the second etch stop layer 60 includes a same dielectric material selected from silicon oxide and silicon nitride. If the first etch stop layers 54 and the second etch stop layer 60 include silicon oxide, the gate cap dielectrics 56 include a material different from silicon oxide, which can be, for example, silicon nitride. If the first etch stop layers 54 and the second etch stop layer 60 include silicon nitride, the gate cap dielectrics 56 include a material different from silicon nitride, which can be, for example, silicon oxide.

Figure 4:
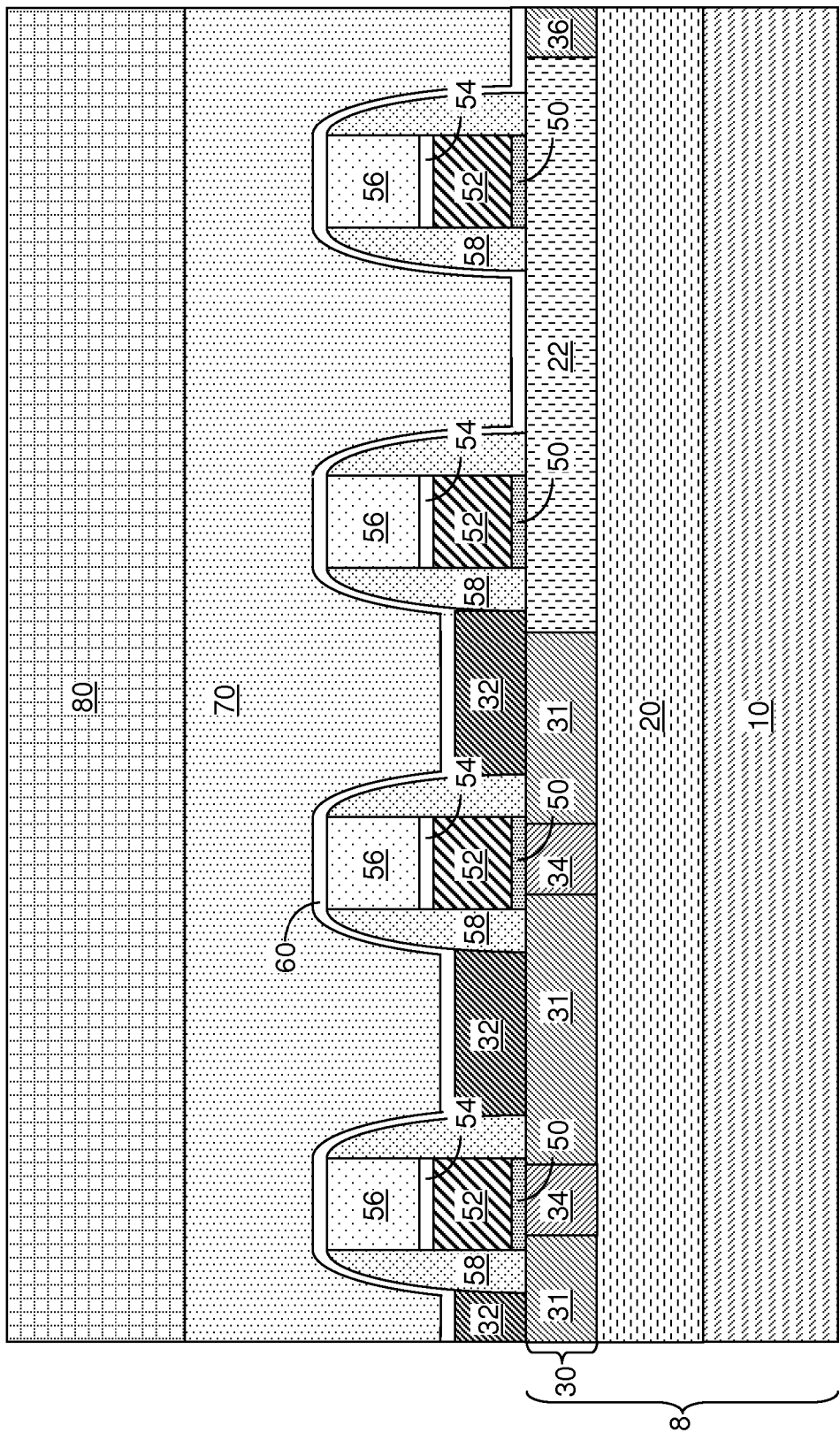
FIG. 4 is a vertical cross-sectional view of the first exemplary semiconductor structure according to the first embodiment of the present disclosure after formation of a first contact-level dielectric layer and a second contact-level dielectric layer.

Referring to FIG. 4, a first contact-level dielectric layer 70 including a first dielectric material is deposited over the second etch stop layer 60, for example, by chemical vapor deposition or spin coating. The top surface of the first contact-level dielectric layer 70 can be formed as a planar layer, which can be formed by spin-coating. Alternatively, the top surface of the first contact-level dielectric layer 70 can be deposited in a non-self-planarizing deposition process such as chemical vapor deposition, and subsequently planarized, for example, by chemical mechanical planarization. The planarized top surface of the first contact-level dielectric layer 70 is located above the topmost surface of the second etch stop layer 60. The vertical distance between the planarized top surface of the first contact-level dielectric layer 70 and the topmost surface of the second etch stop layer 60 can be from 30 nm to 600 nm, and typically from 40 nm to 100 nm, although lesser and greater vertical distances can also be employed.

Referring to FIG. 4, the first contact-level dielectric layer 70 includes a dielectric material that is different from the dielectric materials of the first etch stop layers 54 and the second etch stop layer 60. Thus, each of the first etch stop layers 54 and the second etch stop layer 60 includes a material that is different from the material of the gate cap dielectrics 56 and the material of the first contact-level dielectric material layer 70. The first contact-level dielectric material layer 70 may have the same material as, or may have a different material from, the gate cap dielectrics 56.

For example, if the first etch stop layers 54 and the second etch stop layer 60 includes a dielectric metal oxide, the first-contact level dielectric layer 70 can include silicon oxide, silicon nitride, or organosilicate glass. If the first etch stop layers 54 or the second etch stop layer 60 includes silicon oxide, the first contact-level dielectric layer 70 includes a dielectric material that is different from silicon oxide, which can be silicon nitride or organosilicate glass. If the first etch stop layers 54 or the second etch stop layer 60 includes silicon nitride, the first contact-level dielectric layer 70 includes a dielectric material that is different from silicon nitride, which can be silicon oxide or organosilicate glass.

Subsequently, a second contact-level dielectric layer 80 including a second dielectric material is deposited over the first contact-level dielectric layer 70, for example, by chemical vapor deposition or spin coating. The second dielectric material is different from the first dielectric material, and can be silicon oxide, silicon nitride, or organosilicate glass. The thickness of the second contact-level dielectric layer 80 can be from 30 nm to 600 nm, and typically from 60 nm to 300 nm, although lesser and greater thicknesses can also be employed.

In one embodiment, the gate cap dielectrics 56 can have the same dielectric material as the first contact-level dielectric layer 70, i.e., both the gate cap dielectrics 56 and the first contact-level dielectric layer 70 can have the first dielectric material. For example, if the first dielectric material is silicon oxide, the second dielectric material, i.e., the dielectric material of the second contact-level dielectric layer 80, can be silicon nitride or organosilicate glass. If the first dielectric material is silicon nitride, the second dielectric material can be silicon oxide or organosilicate glass.

Figure 5:
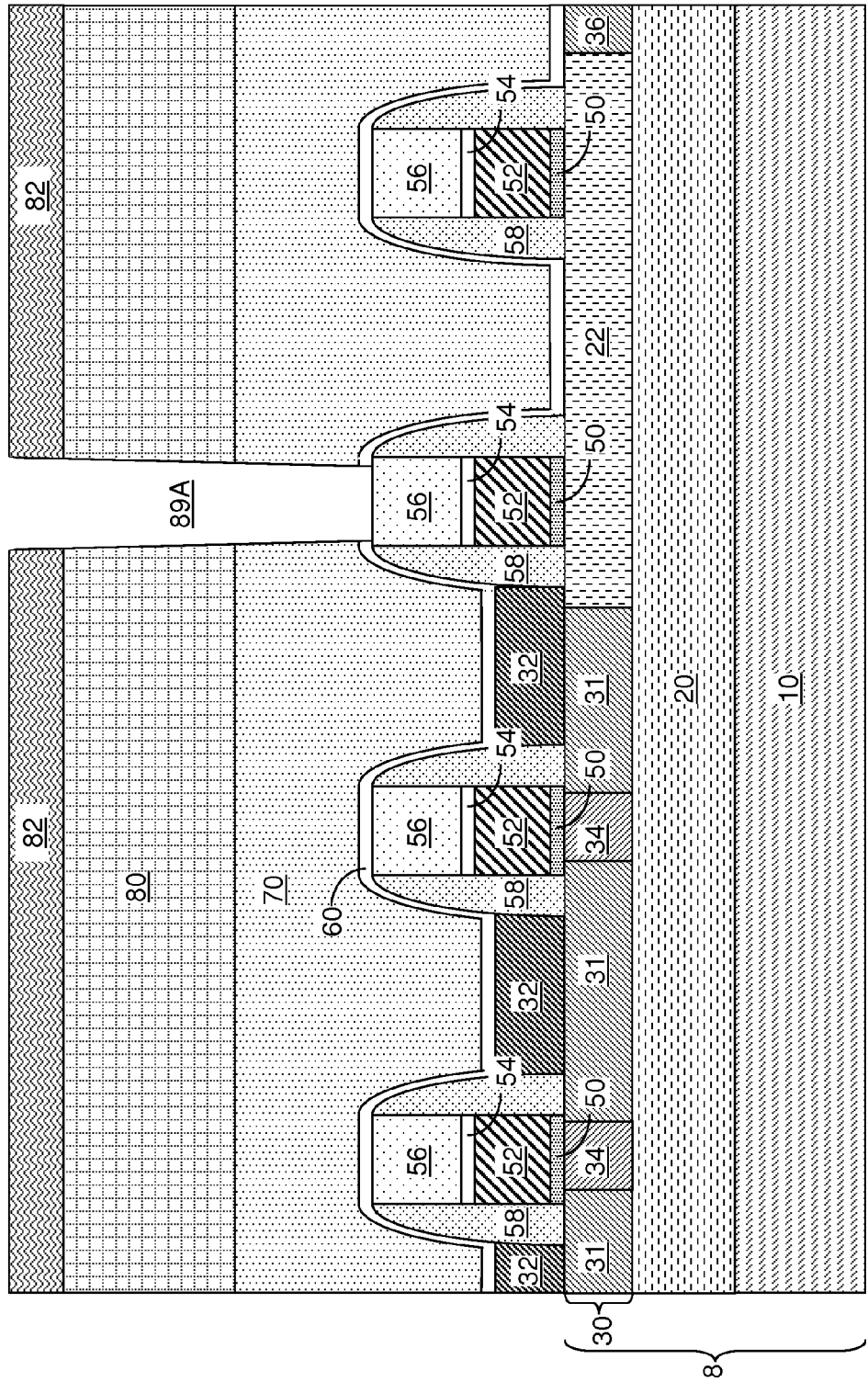
FIG. 5 is a vertical cross-sectional view of the first exemplary semiconductor structure according to the first embodiment of the present disclosure after formation of a first gate contact via hole.

Referring to FIG. 5, at least one first gate contact via hole 89A can be formed by a combination of lithographic methods and an anisotropic etch. As used herein, a gate contact via hole refers to a hole or a cavity that is formed above a gate conductor 52. For example, a trilayer photoresist-containing material stack known in the art may be employed. Specifically, a stack of lithographic materials including, from bottom to top, a first optically planarizing layer (OPL) 82, a first anti-reflective coating (ARC) layer (not shown), and a first photoresist (not shown) can be applied over the second contact-level dielectric layer 80. The first photoresist is lithographically patterned to form at least one opening therein. The pattern in the first photoresist is transferred through the underlying first ARC layer and the first OPL 82, and then through the second contact-level dielectric layer 80 and the first contact-level dielectric layer 70 by an anisotropic etch. The first photoresist and the first ARC layer are typically consumed during the anisotropic etch before the at least one first gate contact via hole 89A extends to the top surface of the second etch stop layer 60. The chemistry of the anisotropic etch during the etching of the first contact-level dielectric layer 70 is selective to the material of the second etch stop layer 60. Thus, the anisotropic etch stops on the top surface of the second etch stop layer 60.

The locations of the at least one opening in the first photoresist and the corresponding at least one first gate contact via hole 89A are selected so that the at least one first gate contact via hole 89A land on portions of the second etch stop layer 60 above the gate cap dielectrics 56. Another etch, which can be an isotropic etch such as a wet etch or an anisotropic etch such as a reactive ion etch, is performed to remove exposed portions of the second etch stop layer 60 and to expose top surfaces of the gate cap dielectrics 56 at the bottom of the at least one first gate contact via hole 89A. Thus, the at least one first gate contact via hole 89A extends through the second and first contact-level dielectric layers (80, 70) and to a surface of the at least one gate cap dielectric 56. The first OPL 82 is subsequently removed.

Figure 6:
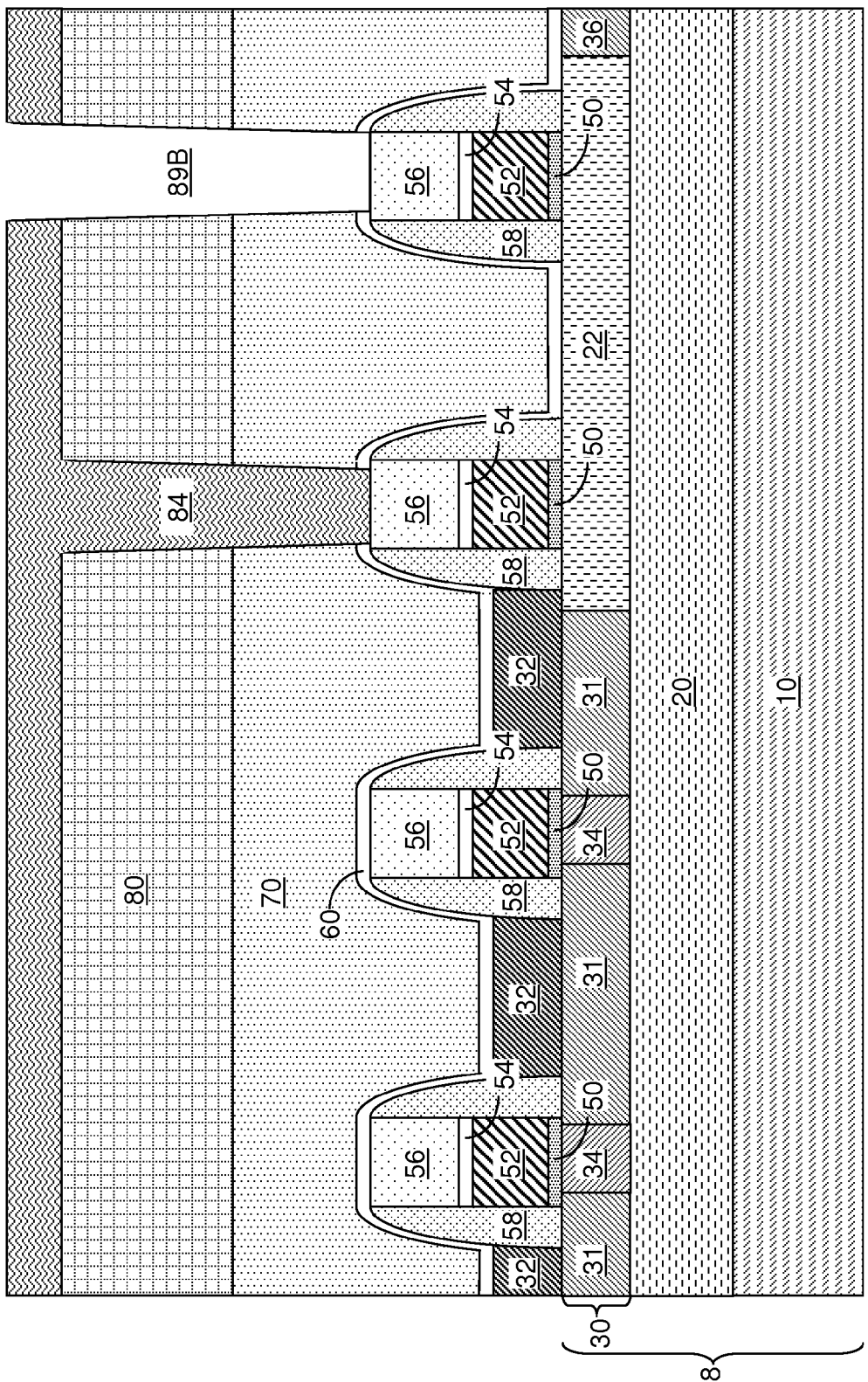
FIG. 6 is a vertical cross-sectional view of the first exemplary semiconductor structure according to the first embodiment of the present disclosure after formation of a second gate contact via hole.

Referring to FIG. 6, at least one second gate contact via hole 89B can be formed by a combination of lithographic methods and an anisotropic etch. For example, a trilayer photoresist-containing material stack, which includes a stack of lithographic materials including, from bottom to top, a second optically planarizing layer (OPL) 84, a second anti-reflective coating (ARC) layer (not shown), and a second photoresist (not shown) can be applied over the second contact-level dielectric layer 80. The second OPL 84 fills the at least one first gate contact via hole 89A during the formation of the at least one second gate contact via hole 89B. The second photoresist is lithographically patterned to form at least one opening therein. The at least one opening in the second photoresist is formed at different locations than the at least one opening in the first photoresist so that multiple gate contact via holes having a sublithographic pitch can be formed.

As uses herein, a "lithographic pitch" is any pitch that can be printed on a photoresist in a single lithographic exposure.

A "minimum lithographic pitch" is the smallest lithographic pitch. A "sublithographic pitch" is a pitch that is smaller than the lithographic pitch. Thus, a pattern including a sublithographic pitch cannot be printed on a photoresist in a single lithographic exposure. While a lithographic pitch and a sublithographic pitch are defined only in relation to available lithography tools and normally changes from generation to generation of semiconductor technology, it is understood that the lithographic pitch and the sublithographic pitch are to be defined in relation to the best performance of lithography tools available at the time of semiconductor manufacturing. As of the filing date of this application, the minimum lithographic pitch is about 80 nm and is expected to shrink in the future.

The pattern in the second photoresist is transferred through the underlying second ARC layer and the second OPL 84, and then through the second contact-level dielectric layer 80 and the first contact-level dielectric layer 70 by an anisotropic etch. The second photoresist and the second ARC layer are typically consumed during the anisotropic etch before the at least one second gate contact via hole 89B extends to the top surface of the second etch stop layer 60. The chemistry of the anisotropic etch during the etching of the first contact-level dielectric layer 70 is selective to the material of the second etch stop layer 60. Thus, the anisotropic etch stops on the top surface of the second etch stop layer 60.

The locations of the at least one opening in the second photoresist and the corresponding at least one second gate contact via hole 89B are selected so that the at least one second gate contact via hole 89B land on portions of the second etch stop layer 60 above the gate cap dielectrics 56. Another etch, which can be an isotropic etch such as a wet etch or an anisotropic etch such as a reactive ion etch, is performed to remove exposed portions of the second etch stop layer 60 and to expose top surfaces of the gate cap dielectrics 56 at the bottom of the at least one second gate contact via hole 89B. Thus, the at least one second gate contact via hole 89B extends through the second and first contact-level dielectric layers (80, 70) and to a surface of the at least one gate cap dielectric 56. The second OPL is subsequently removed.

While an embodiment is herein illustrated in which two sets of gate contact via holes are formed in two separate sets of lithographic steps and etch steps, embodiments can also be employed in which all gate contact via holes are formed in a single set of lithographic exposure and development and subsequent etch steps. Further, embodiments can be employed in which more than two sets of gate contact via holes are formed in more than two separate sets of lithographic steps and etch steps.

Figure 7:
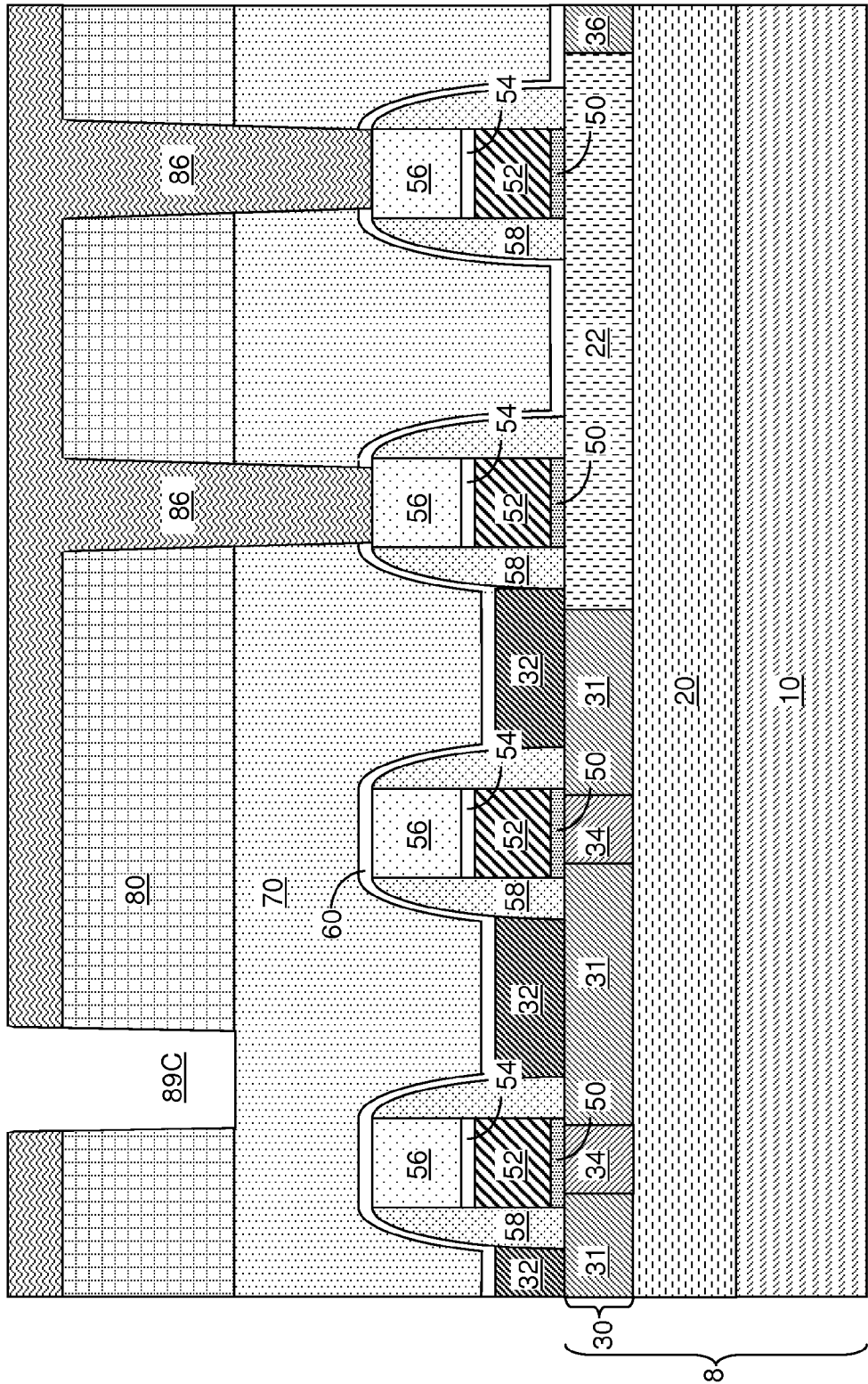
FIG. 7 is a vertical cross-sectional view of the first exemplary semiconductor structure according to the first embodiment of the present disclosure after formation of a first source/drain contact via hole.

Referring to FIG. 7, at least one first source/drain contact via hole 89C can be formed by a combination of lithographic methods and an anisotropic etch. As used herein, a source/drain contact via hole refers to a hole or a cavity that is formed above a component that functions as a source, a drain, or a common source and drain. Specifically, each stack of the planar source/drain region 31 and the raised source/drain region 32 functions as a source, a drain, or a common source and drain. For example, a trilayer photoresist-containing material stack, which includes a stack of lithographic materials including, from bottom to top, a third optically planarizing layer (OPL) 86, a third anti-reflective coating (ARC) layer (not shown), and a third photoresist (not shown) can be applied over the second contact-level dielectric layer 80. The third OPL 86 fills the at least one first gate contact via hole 89A and the at least one second gate contact via hole 89B during the formation of the at least one first source/drain contact via hole 89C. The third photoresist is lithographically patterned to form at least one opening therein. The at least one opening in the third photoresist is formed at different locations than the at least one opening in the first photoresist and the at least one opening in the second photoresist.

The pattern in the third photoresist is transferred through the underlying third ARC layer and the third OPL 86. This pattern is then transferred through the second contact-level dielectric layer 80 by an anisotropic etch. The third photoresist and the third ARC layer are typically consumed during the anisotropic etch before the at least one first source/drain contact via hole 89C extends to the top surface of the first contact-level dielectric layer 70. The chemistry of the anisotropic etch during the etching of the second contact-level dielectric layer 80 is selective to the material of the first contact-level dielectric layer 70. Thus, the anisotropic etch stops on the top surface of the first contact-level dielectric layer 70.

The locations of the at least one opening in the third photoresist and the corresponding at least one first source/drain contact via hole 89C are selected so that the at least one first source/drain contact via hole 89C overlie at least a portion of the raised source/drain regions 32. An overlay variation during the lithographic exposure of the third photoresist may cause the at least one first source/drain contact via hole 89C to overlie a portion of the gate spacers 58 or even a portion of the gate cap dielectrics 56. In some embodiment, self-aligned structures can be formed so that peripheral portions of the at least one first source/drain contact via hole 89C overlie portions of the gate spacers 58. The third OPL 86 is subsequently removed.

Figure 8:
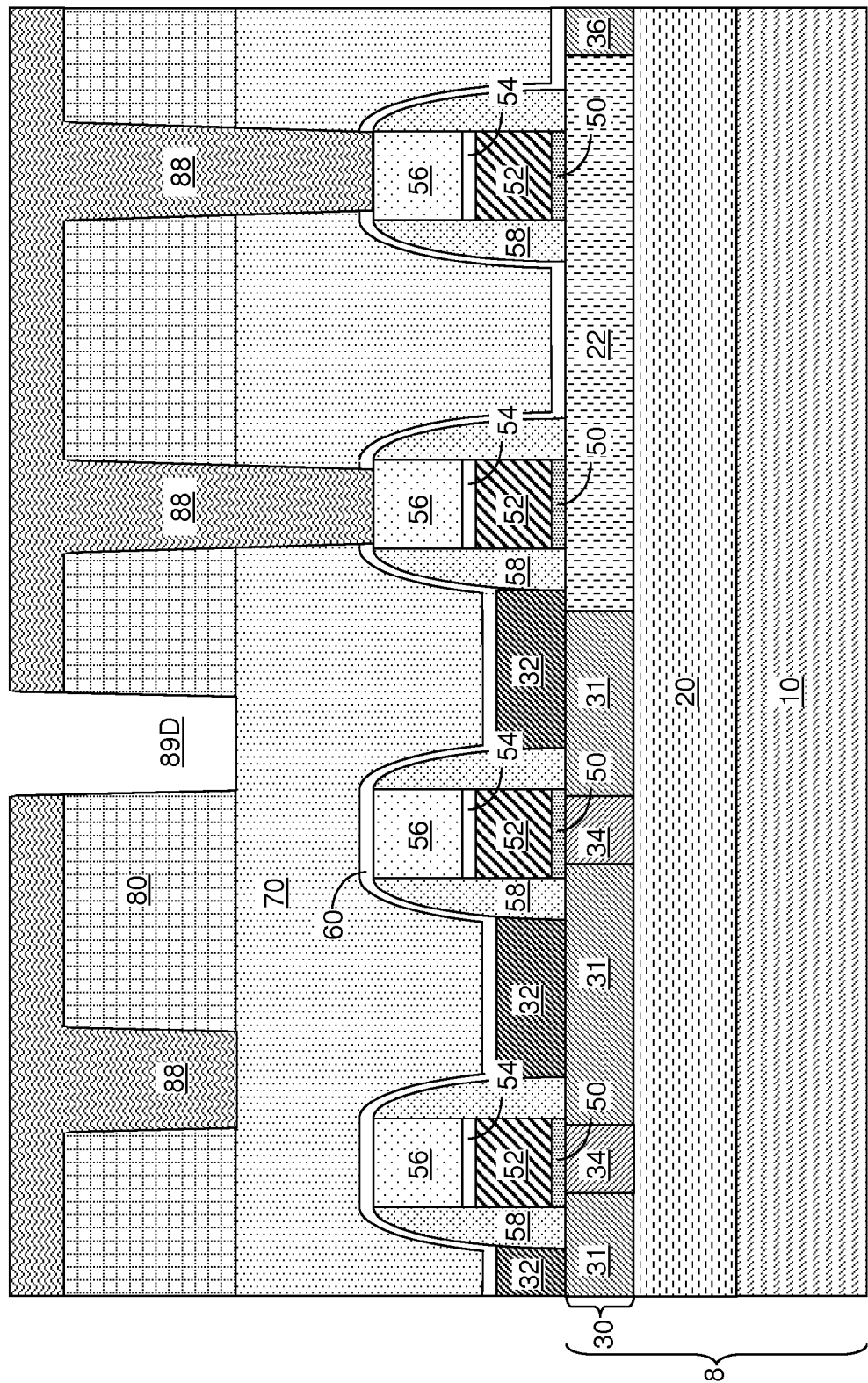
FIG. 8 is a vertical cross-sectional view of the first exemplary semiconductor structure according to the first embodiment of the present disclosure after formation of a second source/drain contact via hole.

Referring to FIG. 8, at least one second source/drain contact via hole 89D can be formed by a combination of lithographic methods and an anisotropic etch. For example, a trilayer photoresist-containing material stack, which includes a stack of lithographic materials including, from bottom to top, a fourth optically planarizing layer (OPL) 88, a fourth anti-reflective coating (ARC) layer (not shown), and a fourth photoresist (not shown), can be applied over the second contact-level dielectric layer 80. The fourth OPL 88 fills the at least one first gate contact via hole 89A, the at least one second gate contact via hole 89B, and the at least one first source/drain contact via hole 89C during the formation of the at least one second source/drain contact via hole 89D. The fourth photoresist is lithographically patterned to form at least one opening therein. The at least one opening in the fourth photoresist is formed at different locations than the at least one opening in the first, second, and third photoresists.

The pattern in the fourth photoresist is transferred through the underlying fourth ARC layer and the fourth OPL 88. This pattern is then transferred through the second contact-level dielectric layer 80 by an anisotropic etch. The fourth photoresist and the fourth ARC layer are typically consumed during the anisotropic etch before the at least one second source/drain contact via hole 89D extends to the top surface of the first contact-level dielectric layer 70. The chemistry of the anisotropic etch during the etching of the second contact-level dielectric layer 80 is selective to the material of the first contact-level dielectric layer 70. Thus, the anisotropic etch stops on the top surface of the first contact-level dielectric layer 70.

The locations of the at least one opening in the fourth photoresist and the corresponding at least one second source/drain contact via hole 89D are selected so that the at least one second source/drain contact via hole 89D overlie at least a portion of the raised source/drain regions 32. An overlay variation during the lithographic exposure of the third photoresist may cause the at least one second source/drain contact via hole 89D to overlie a portion of the gate spacers 58 or even a portion of the gate cap dielectrics 56. In some embodiment, self-aligned structures can be formed so that peripheral portions of the at least one first source/drain contact via hole 89D overlie a portion of the gate spacers 58 or even a portion of the gate cap dielectrics 56.

While an embodiment is herein illustrated in which two sets of source/drain contact via holes are formed in two separate sets of lithographic steps and etch steps, embodiments can also be employed in which all source/drain contact via holes are formed in a single set of lithographic exposure and development and subsequent etch steps. Further, embodiments can be employed in which more than two sets of source/drain contact via holes are formed in more than two separate sets of lithographic steps and etch steps.

While an embodiment is illustrated herein that employs a trilayer photoresist-containing material stack for the processing steps for each of FIGS. 5-8, the trilayer photoresist-containing material stack may be replaced with any other type of photoresist-containing material stack such as a single layer of photoresist or a bilayer photoresist-containing material stack of an anti-reflective coating layer and an overlying photoresist at processing steps for one or more of FIGS. 5-8.

Figure 9:
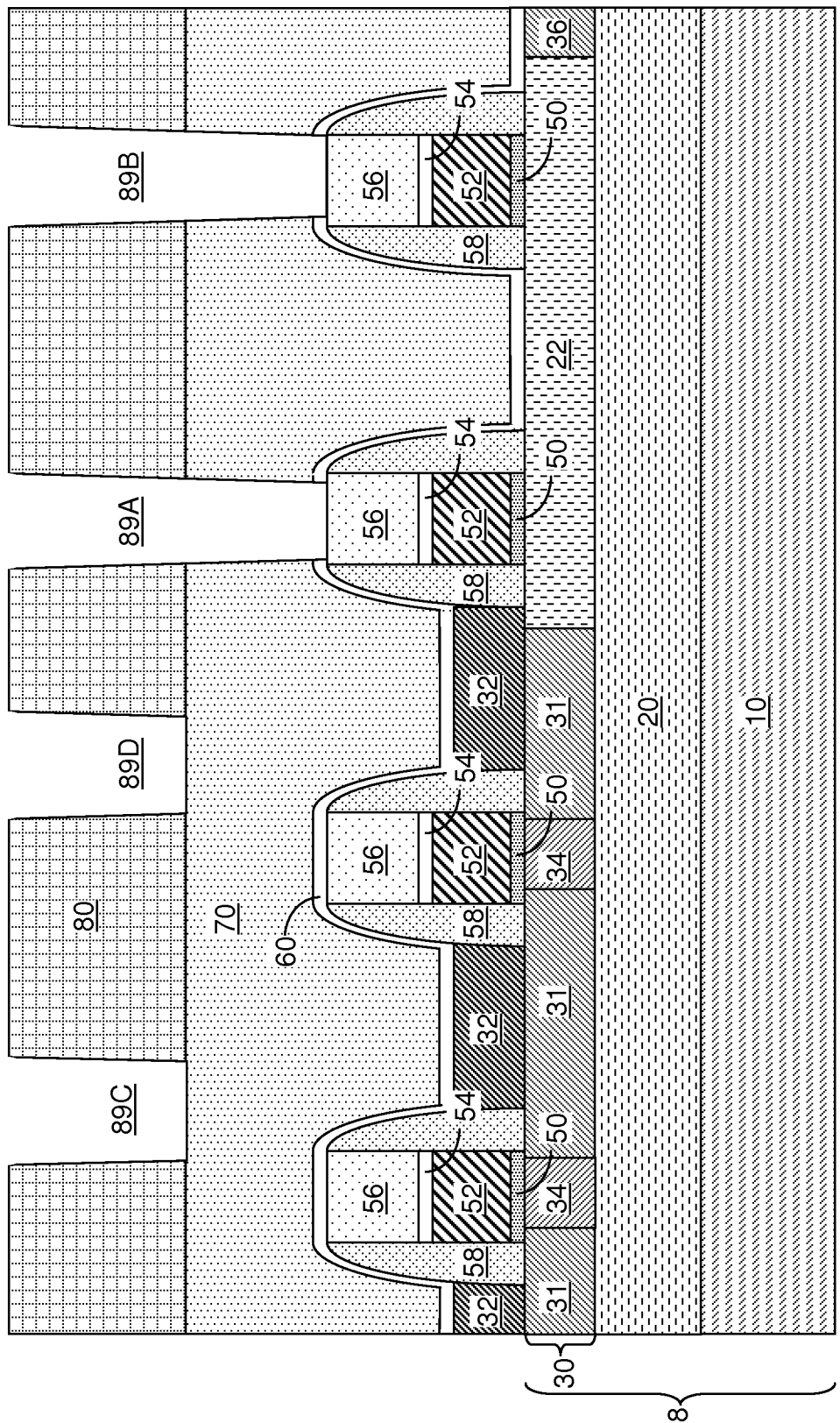
FIG. 9 is a vertical cross-sectional view of the first exemplary semiconductor structure according to the first embodiment of the present disclosure after removal of optically planarizing material portions.

Referring to FIG. 9, the fourth OPL 88 is subsequently removed from above the second contact-level dielectric layer 80 and from the at least one first gate contact via hole 89A, the at least one second gate contact via hole 89B, and the at least one first source/drain contact via hole 89C.

Each of the at least one first gate contact via hole 89A and the at least one second gate contact via hole 89B extends through the second and first contact-level dielectric layers (80, 70) and to a surface of the gate cap dielectrics 56 at this step.

Figure 10:
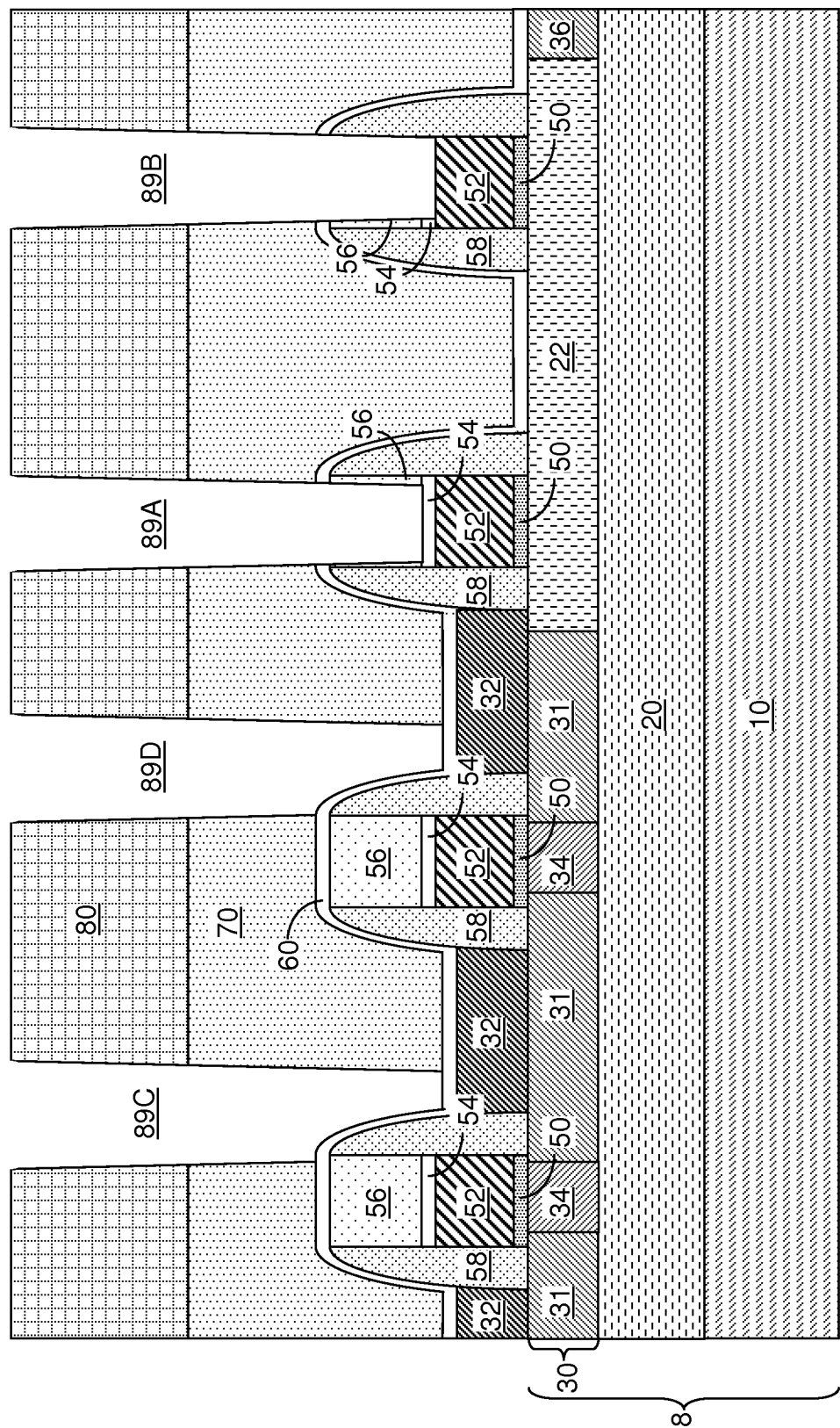
FIG. 10 is a vertical cross-sectional view of the first exemplary semiconductor structure according to the first embodiment of the present disclosure after vertically extending various contact via holes to first etch stop layers or to the second etch stop layer.

Referring to FIG. 10, the at least one first gate contact via hole 89A, the at least one second gate contact via hole 89B, the at least one first source/drain contact via hole 89C, and the at least one second source/drain contact via hole 89D are vertically extended downward by an anisotropic etch until top surfaces of the first etch stop layers 54 and top surfaces of the second etch stop layer 60 are exposed. This etch process is herein referred to as an extension etch. The chemistry of the anisotropic etch is selective to the dielectric materials of the first etch stop layers 54 and the second etch stop layer 60. Thus, during the simultaneous extension of the first and second gate contact via holes (89A, 89B) and the source/drain contact via holes (89C, 89D), the first and second gate contact via holes (89A, 89B) extend downward through the gate cap dielectrics 56, stopping on the first etch stop layer, and the source/drain contact via holes (89C, 89D) extend downward through the first dielectric layer 70, stopping on the second etch stop layer 60. The extension etch can be selective to the dielectric materials of the first etch stop layers 54 and the second etch stop layer 60 because each of the first etch stop layers 54 and the second etch stop layer 60 includes a material that is different from the dielectric material of the gate cap dielectrics 56 and the dielectric materials of the first contact-level dielectric material layer 70.

Figure 11:
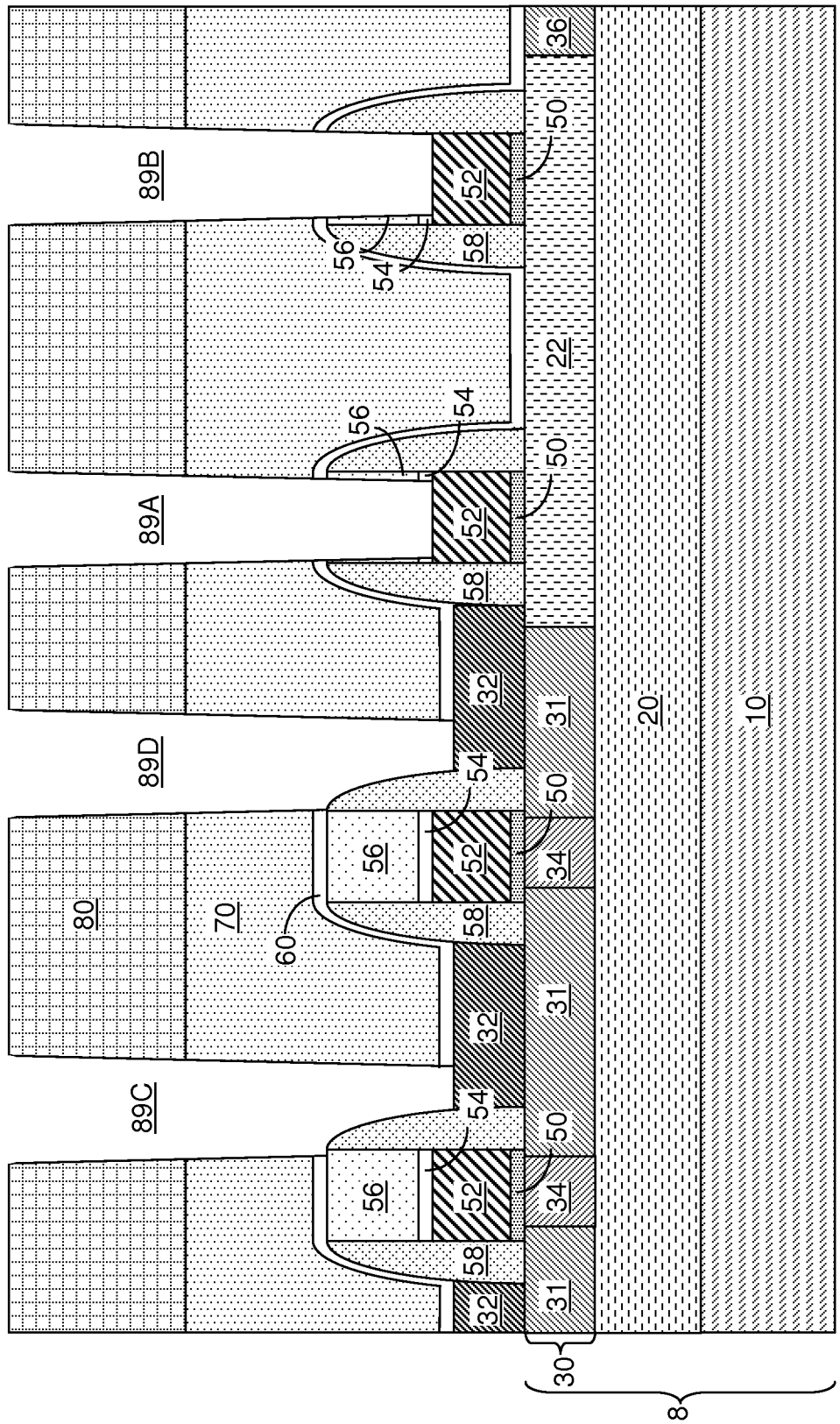
FIG. 11 is a vertical cross-sectional view of the first exemplary semiconductor structure according to the first embodiment of the present disclosure after removal of exposed portions of the first etch stop layers and the second etch stop layer.

Referring to FIG. 11, exposed portions of the first etch stop layers 54 in the first and second gate contact via holes (89A, 89B) and exposed portions of the second etch stop layer 60 in the first and second source/drain contact via holes (89C, 89D) can be removed, for example, by an isotropic etch such as a wet etch or an anisotropic etch such as a reactive ion etch. The exposed portions of the first etch stop layers 54 and the exposed portions of the second etch stop layer 60 can be removed sequentially or simultaneously. If the first etch stop layers 54 and the second etch stop layer 60 include the same dielectric material, the exposed portions of the first etch stop layer 54 and the exposed portions of the second etch stop layer 60 are removed simultaneously.

Figure 12:
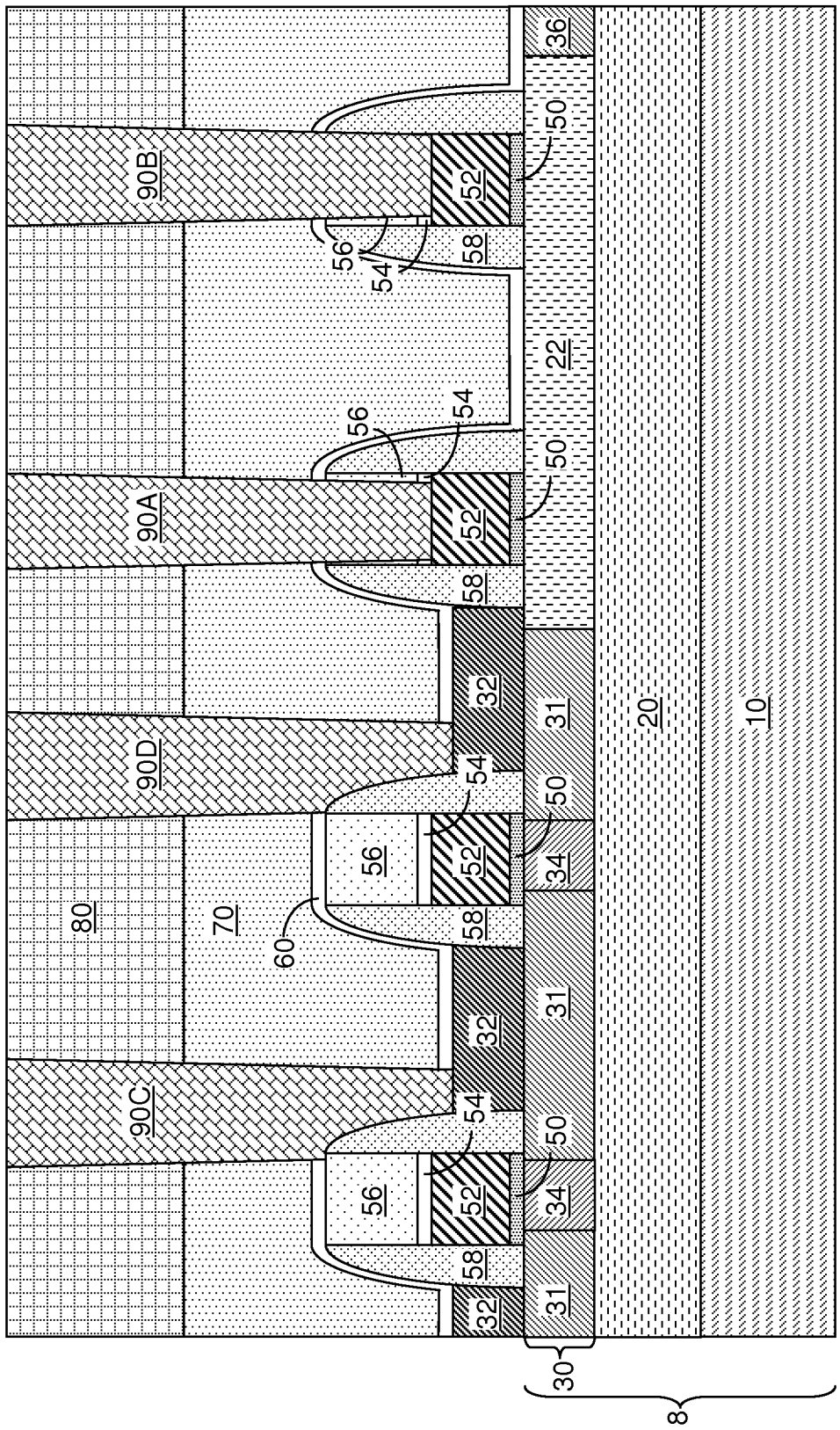
FIG. 12 is a vertical cross-sectional view of the first exemplary semiconductor structure according to the first embodiment of the present disclosure after formation of self-aligned contact via structures.

Referring to FIG. 12, various self-aligned contact via structures are formed by filling the various contact via holes (89A, 89B, 89C, 89D) with a conductive material and by removing excess portions of the conductive material above the second contact-level dielectric layer 80, for example, by a recess etch, chemical mechanical planarization, or a combination thereof.

The various self-aligned contact via structures include gate contact via structures (90A, 90B) that are embedded in the first and second contact-level dielectric layers (70, 80). Each of the gate contact via structures (90A, 90B) extends through the first and second contact-level dielectric layers (70, 80), the second etch stop layer 60, one of the gate cap dielectrics 54, and one of the first etch stop layer 54.

Further, the various self-aligned contact via structures include source/drain contact via structures (90C, 90D) embedded in the first and second contact-level dielectric layers (70, 80). Each of the source/drain contact via structures (90C, 90D) extends through the first and second contact-level dielectric layers (70, 80) and the second etch stop layer 60 and contacts a source/drain region, which is a stack of a planar source/drain region 31 and a raised source/drain region 32, that is located on the semiconductor substrate 8. If the overlay between the gate structures (50, 52, 54, 56) and the source/drain contact via structures (90C, 90D) is not perfect, which can happen with a significant probability during lithographic processes, a portion of the source/drain contact via structures (90C, 90D) can contact an outer surface of the gate spacers 58. Further, one or more source/drain contact via structures (90C, 90D) can intentionally contact an outer surface of the gate spacers 58 or overlie peripheral portions of gate cap dielectrics 56, even though directly physical contact between source/drain contact via structures (90C, 90D) and conductive portions of gate structures is not desired. In addition, within each portion of a gate structure (50, 52, 54, 56) that is not contacted by a gate contact via structure (90A, 90B), each of the gate conductor 52, the first etch stop layer 54, and the gate cap dielectric 56 therein can have a same width, which is the distance between two vertical sidewalls of the gate structure (50, 52, 54, 56).

Figure 13:
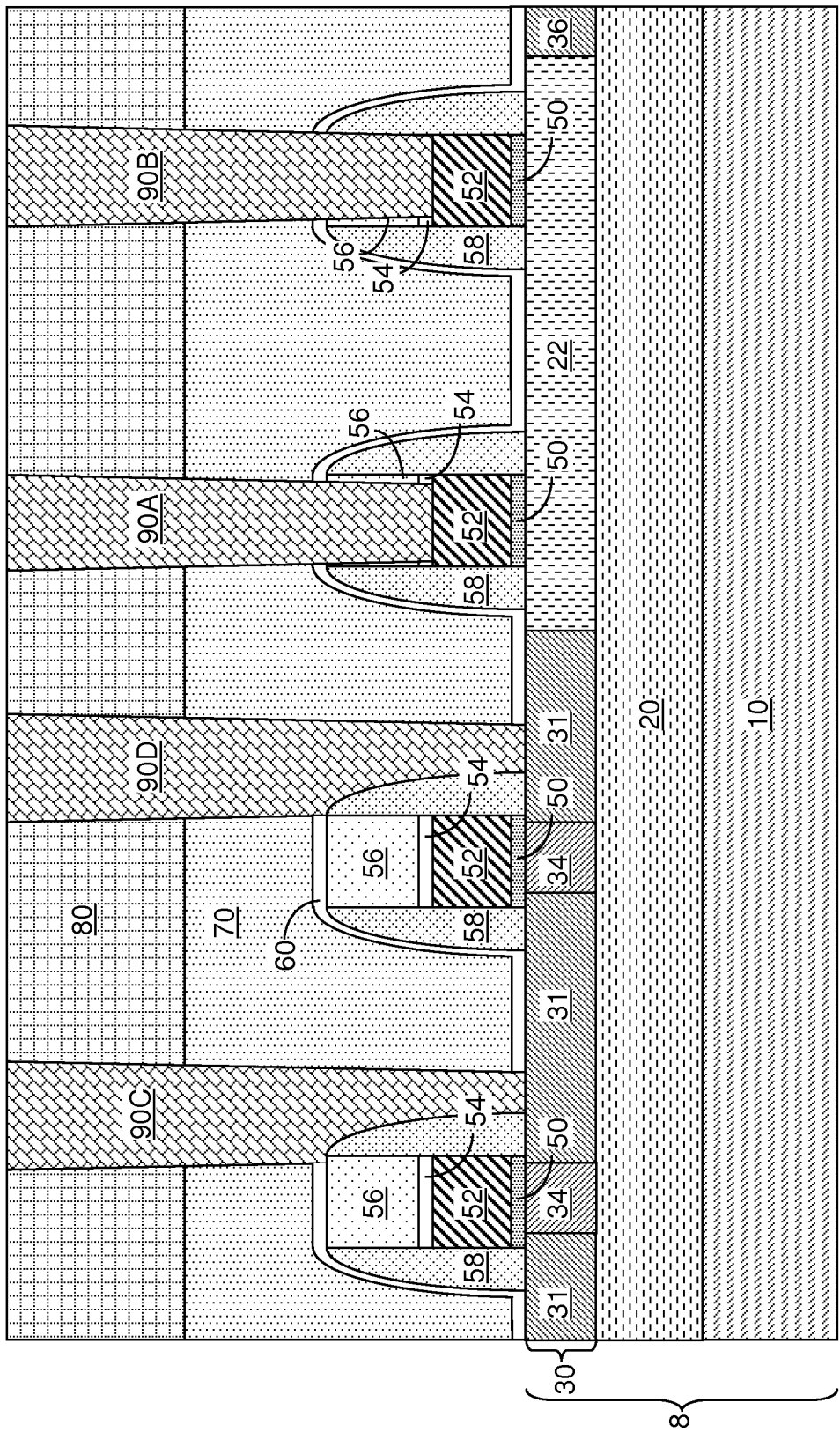
FIG. 13 is a vertical cross-sectional view of a second exemplary semiconductor structure according to a second embodiment of the present disclosure.

Referring to FIG. 13, a second exemplary semiconductor structure according to a second embodiment of the present disclosure is derived from the first exemplary semiconductor structure by omitting the formation of raised source/drain regions 32. In this embodiment, each of the source/drain contact via structures (90C, 90D) extends through the first and second contact-level dielectric layers (70, 80) and the second etch stop layer 60 and contacts a source/drain region, which includes only a planar source/drain region 31 located on the semiconductor substrate 8.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:
1. A semiconductor structure comprising:
at least one gate structure located on a semiconductor substrate, wherein each of said at least one gate structure includes, from bottom to top, a gate dielectric, a gate conductor, a first etch stop layer, and a gate cap dielectric;

a second etch stop layer located on said at least one gate structure;

a first contact-level dielectric layer and a second contact-level dielectric layer located over said second etch stop layer;

at least one gate contact via structure embedded in said first and second contact-level dielectric layers, wherein each of said at least one gate contact via structure extends through said first and second contact-level dielectric layers, said second etch stop layer, one of said at least one gate cap dielectric, and one of said at least one first etch stop layer; and at least one source/drain contact via structure embedded in said first and second contact-level dielectric layers, wherein each of said at least one source/drain contact via structure extends through said first and second contact-level dielectric layers and said second etch stop layer.

2. The semiconductor structure of claim 1, further comprising at least one gate spacer located on said semiconductor substrate, wherein each of said at least one gate spacer laterally surrounds one of said at least one gate structure.

3. The semiconductor structure of claim 2, wherein said second etch stop layer is located directly on said at least one gate spacer.

4. The semiconductor structure of claim 2, wherein said at least one gate spacer comprises a different material than said at least one first etch stop layer and said second etch stop layer.

5. The semiconductor structure of claim 2, wherein a portion of said at least one source/drain contact via structure contacts an outer surface of said at least one gate spacer.

6. The semiconductor structure of claim 2, wherein one of said at least one gate spacer laterally surrounds one of said at least one gate structure, said one of said at least one gate structure in which a gate conductor, a first etch stop layer, and a gate cap dielectric have a same width.

7. The semiconductor structure of claim 2, wherein one of said at least one gate contact via structure contacts an inner sidewall of one of said at least one gate spacer.

8. The semiconductor structure of claim 2, wherein one of said at least one source/drain contact via structure contacts an outer sidewall of one of said at least one gate spacer.

9. The semiconductor structure of claim 1, wherein said at least one first etch stop comprises a material that is different from a material of said at least one gate cap dielectric and said first contact-level dielectric material layer.

10. The semiconductor structure of claim 9, wherein said second etch stop layer comprises a material that is different from said material of said at least one gate cap dielectric and said first contact-level dielectric material layer.

11. The semiconductor structure of claim 1, each of said at least one first etch stop layer and said second etch stop layer comprises a material that is different from a material of said at least one gate cap dielectric and said first contact-level dielectric material layer.

12. The semiconductor structure of claim 11, wherein each of said at least one first etch stop layer and said second etch stop layer is selected from $HfO_2$, $Y_2O_3$, and $Al_2O_3$.

13. The semiconductor structure of claim 11, wherein said at least one first etch stop layer and said second etch stop layer comprise a same dielectric metal oxide.

14. The semiconductor structure of claim 1, wherein each of said at least one first etch stop layer and said second etch stop layer comprises a material selected from silicon oxide, silicon nitride, and a dielectric metal oxide.

15. The semiconductor structure of claim 14, wherein each of said at least one first etch stop layer and said second etch stop layer comprises a dielectric metal oxide.

16. The semiconductor structure of claim 1, wherein said at least one gate cap dielectric and said first contact-level dielectric layer comprise a first dielectric material, and said second contact-level dielectric layer comprises a second dielectric material different from said first dielectric material.

17. The semiconductor structure of claim 1, wherein said at least one first etch stop layer includes a conductive metallic compound.

18. The semiconductor structure of claim 1, wherein each of said at least one source/drain contact via structure contacts a source/drain region on said semiconductor substrate.

19. The semiconductor structure of claim 18, wherein said second etch stop layer contacts at least one source/drain region.

20. The semiconductor structure of claim 1, wherein each of said at least one source/drain contact via structure contacts a raised source/drain region located on a top surface of said semiconductor substrate.

* * * * *